United States Patent

Nava et al.

[11] Patent Number: 6,138,264
[45] Date of Patent: Oct. 24, 2000

[54] SYNDROME CALCULATION CIRCUIT

[75] Inventors: Mario Diaz Nava, Saint Martin D'Heres; Joseph Bulone, Grenoble, both of France

[73] Assignee: SGS-Thomson Microelectronics S.A., Gentilly, France

[21] Appl. No.: 08/662,778

[22] Filed: Jun. 10, 1996

[30] Foreign Application Priority Data

Jun. 22, 1995 [FR] France .................................. 95 07736

[51] Int. Cl.$^7$ ................................................ H03M 13/00
[52] U.S. Cl. ........................ 714/785; 370/463; 370/464
[58] Field of Search .................................. 370/94.1, 463, 370/464, 905, 902; 714/752, 784, 785, 774, 755, 756, 766, 767, 768

[56] References Cited

U.S. PATENT DOCUMENTS

| | | | |
|---|---|---|---|
| 4,630,271 | 12/1986 | Yamada | 714/760 |
| 4,694,455 | 9/1987 | Koga | 714/782 |
| 4,819,231 | 4/1989 | Yamada | 375/367 |
| 4,845,713 | 7/1989 | Zook | 714/784 |
| 4,959,834 | 9/1990 | Aikawa et al. | 714/798 |
| 5,003,539 | 3/1991 | Takemoto et al. | 714/785 |
| 5,282,215 | 1/1994 | Hyodo et al. | 714/775 |
| 5,383,203 | 1/1995 | Miyazono | 714/785 |
| 5,570,377 | 10/1996 | Gonzalez et al. | 714/785 |
| 5,610,929 | 3/1997 | Yamamoto | 714/785 |

FOREIGN PATENT DOCUMENTS

WO-A-87 06036 10/1987 WIPO .............................. G06F 11/10

OTHER PUBLICATIONS

Swarts et al. "Undetected Error Probability of Linar Block Codes On Channels With Memory", IEEE. pp. 162–162, 1993.

Ju et al., "Fast Decoding Algorithm for RS Codes", IEEE. pp. 1452–1453, Aug. 14, 1997.

Aboulnasr et al., "Real–Time Systolic Array Precessor For 2–D Spatial Filtering", IEEE. pp. 451–455, Apr. 4, 1988.

Feng et al., "Simplified Understanding and Efficient Decoding of a Class of Algebraic–Geometric Codes", IEEE. pp. 981–1002, Apr. 7, 1994.

French Search Report from French Patent Application Number 95 07736, filed Jun. 22, 1995.

*Primary Examiner*—Albert De Cady
*Assistant Examiner*—McDieunel Marc
*Attorney, Agent, or Firm*—Wolf, Greenfield & Sacks, P.C.; James H. Morris; Theodore E. Galanthay

[57] ABSTRACT

This invention relates to a circuit for calculating a syndrome on packets of n p-bit data, including a syndrome 'register receiving the sum of each received datum and of the contents of the syndrome register modified by a first interconnection matrix corresponding to the p-th power of a generator polynomial. Each received datum defines a new packet of n data and the above-mentioned sum includes the datum preceding the new packet, modified by a second interconnection matrix corresponding to the n-th power of the first matrix.

14 Claims, 3 Drawing Sheets

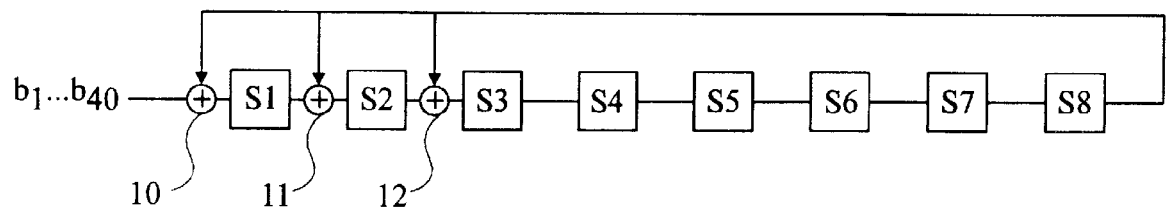
Fig 1
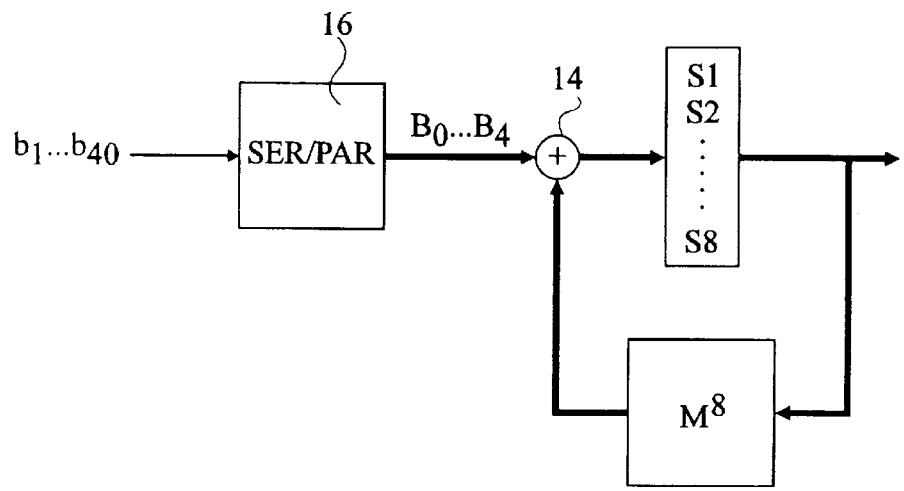
Fig 2
Fig 3

SYNDROME CALCULATION CIRCUIT

BACKGROUND OF THE INVENTION

1. Field of the Invention

The present invention relates to a syndrome calculation circuit for, in particular, detecting the beginning of data packets preceded by headers.

2. Discussion of the Related Art

In ATM ("Asynchronous Transfer Mode") networks, the data is transmitted by packets of 53 bytes, called cells. A cell is constituted by a 5-byte header which indicates, in particular, the destination of the data and a 48-byte payload.

FIG. 1 shows such a header. The header includes four first bytes A1 to A4 followed by an HEC ("Header Error Control") byte for detecting and correcting errors in the first four bytes of the header. The header is used in particular for determining the position of the cells in a continuous data flow. To form the HEC byte at transmission, the following polynomial is first formed:

$$b_1 x^{31} + b_2 x^{30} + \ldots + b_{31} x + b_{32}$$

where $b_1$ to $b_{32}$ are the bits of bytes A1 to A4. This polynomial is multiplied by polynomial $x^8$ and then divided by a polynomial called a generator polynomial of degree 8. The remainder of the division is a polynomial of degree 7, whose coefficients $b_{33}$ to $b_{40}$ are the bits of byte HEC.

At the reception level, coefficients $b_1$ to $b_{40}$ constitute a polynomial of degree 39 which is divided by the generator polynomial. The remainder of this division, called the syndrome, is zero if the transmission was error-free. According to the non-zero value of the syndrome, a double error is detected or a single error is corrected.

FIG. 2 shows an example of a conventional circuit, called Linear Feedback Shift Register (LFSR), which is used to calculate the syndromes. This LFSR circuit is constructed according to the generator polynomial, which, in this case, is $$x^8 + x^2 + x + 1$$

This polynomial is the polynomial generally used in ATM networks for calculating byte HEC.

The LFSR circuit includes 8 flip-flops S1 to S8, respectively corresponding to coefficients S1 to S8 of the syndrome, connected in a ring. Thus, each flip-flop receives the output of the preceding flip-flop and the first flip-flop S1 receives the output of the last flip-flop S8. Besides, flip-flop S1 is preceded by an adder 10 which receives the output of flip-flop S8 and the successive bits to analyze $b_1$ to $b_{40}$. Flip-flops S2 and S3 are preceded by respective adders 11 and 12, each of which receives the output of the preceding flip-flop and the output of flip-flop S8. Adders 10 to 12 are XOR gates in practice.

Initially, flip-flops S1 to S8 are at zero. They are then enabled at each arrival of a bit b of the header to analyze. When the fortieth bit $b_{40}$ has arrived, flip-flops S1 to S8 contain the syndrome coefficients. Once the syndrome has been exploited, the flip-flops are reset and enabled anew to calculate the syndrome of a new header.

In asynchronous networks, such as ATM networks, the reception circuits have to be synchronized on the data cells. For this purpose, the fact that the syndrome is zero for the headers can be utilized. An LFSR circuit is then reset after each 40-bit packet to analyze the following 40-bit packet. If the headers are aligned with the 40-bit packets, a zero syndrome is finally found when a header is analyzed.

However, the headers are not very likely to be aligned with the analyzed 40-bit packets. Thus, if no zero syndrome has been found after a cell length, the analysis has to be shifted by skipping bits in the data flow (after analyzing the last packet of the cell length, one or several bits are allowed to pass before resuming the analysis). By operating so, an alignment of the analyzed packets with the headers is obtained after at most 40 cells. Thus, there is a risk of losing 40 cells at the beginning of a transmission.

To avoid this drawback, one could provide 40 LFSR circuits each analyzing one 40-bit packet shifted by one bit with respect to the packet analyzed by the preceding circuit. This solution is very costly in terms of surface area and power consumption.

Moreover, an LFSR circuit is unable, in present common technologies (CMOS), to process bits arriving at the transmission speeds currently required in ATM networks, that is, speeds which can reach 622 megabits per second.

SUMMARY OF THE INVENTION

An object of the present invention is to provide a syndrome calculation circuit performing a detection of the beginning of a cell in a particularly simple way and avoiding the loss of a great number of cells.

Another object of the present invention is to provide such a circuit in a common technology and that is able to operate at the present transmission speeds in ATM networks.

These and other objects are achieved by providing a syndrome calculation circuit which performs a sliding calculation on n data, the data being words (bytes) or bits, and n being the number of data to take into account in a syndrome calculation (for example, 40). By sliding calculation it is meant that a new syndrome is calculated at each arrival of a datum, the syndrome being calculated on the last n data received. This sliding calculation is obtained essentially by cancelling in the circuit the effect of the (i–n)-th datum received at the time when the i-th datum is received.

The processing speed is increased when the processed data include words or bytes from a series-to-parallel conversion of the bit flow. Indeed, a series-to-parallel converter can operate at particularly high speeds, especially at the speeds required in ATM networks, and the syndrome calculation circuit then only has to operate at the transmission speed divided by the word size.

The present invention more particularly aims at a circuit for calculating a syndrome on packets of n p-bit data, including a syndrome register receiving the sum of each received datum and of the contents of the syndrome register modified by a first interconnection matrix corresponding to the p-th power of a generator polynomial. Each received datum defines a new packet of n data and the above-mentioned sum includes the datum preceding the new packet, modified by a second interconnection matrix corresponding to the n-th power of the first matrix.

According to an embodiment of the present invention, the data are words whose p bits constitute the components of vectors processed by the matrixes.

According to an embodiment of the present invention, the circuit includes for each j-th bit (j=1, 2 . . . , p–1) of a received word, an adder receiving this j-th bit, the output of the adder associated with the (j–1)-th bit through a matrix corresponding to the generator polynomial, and the j-th bit of the word preceding the new packet through a matrix corresponding to the np-th power of the generator polynomial, the adder associated with the first bit receiving the output of the syndrome register.

According to an embodiment of the present invention, the data are bits, each of which constitutes the first component of a vector processed by the matrixes, the vector dimension being equal to the size of the syndrome register.

According to an embodiment of the present invention, the datum preceding the new packet is supplied by a shift register of n data, receiving the data.

These objects, features and advantages, as well as others, of the present invention will be discussed in detail in the following description of specific embodiments, taken in conjunction with the following drawings, but not limited by them.

BRIEF DESCRIPTION OF THE DRAWINGS

FIG. 1 shows a header of a cell transmitted on an ATM network;

FIG. 2 shows a conventional circuit for syndrome calculation on a bit flow;

FIG. 3 shows an embodiment of a circuit for syndrome calculation on a flow of words, for example bytes, from a series-to-parallel conversion of a bit flow;

DETAILED DESCRIPTION

Figure 4:
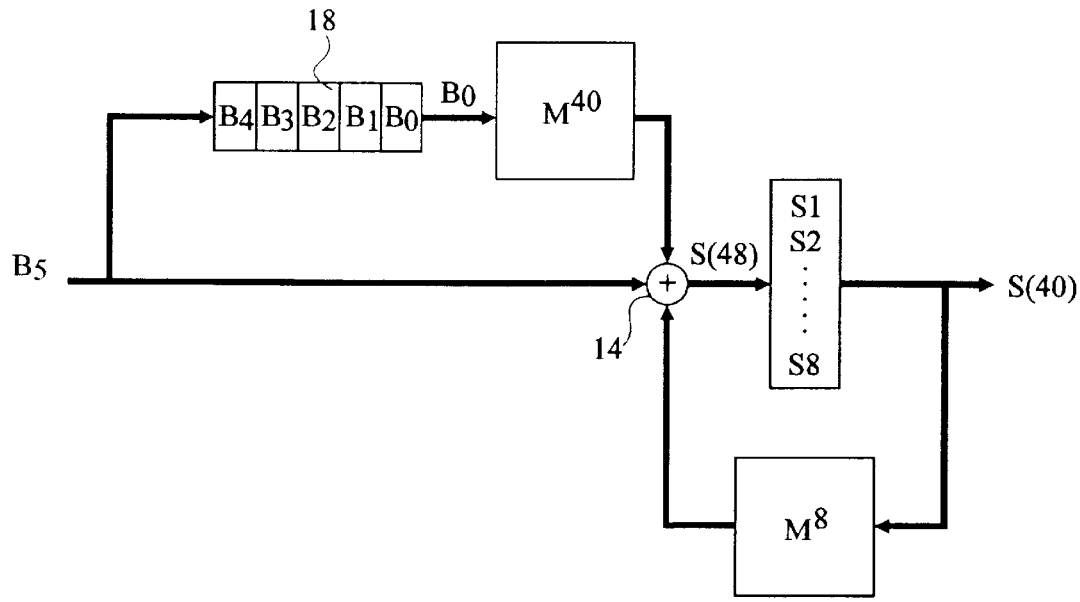
FIG. 4 shows an embodiment of a sliding syndrome calculation circuit according to the present invention, performing calculations on a word flow.

If the operation of the linear feedback shift register of FIG. 2 is equated, the following relation is obtained upon arrival of the (i+1)-th bit to analyze $b_{i+1}$:

$$S(i+1) = b^*_{i+1} + M\,S(i) \qquad (1)$$

where $S(i)$ is the vector whose components are the states S1 to S8 of the flip-flops upon arrival of bit bi; $b^*_{i+1}$ is the vector having bit $b_{i+1}$ as first component and having its seven remaining components equal to zero; and M is the matrix:

$$M = \begin{matrix} 0 & 0 & 0 & 0 & 0 & 0 & 0 & 1 \\ 1 & 0 & 0 & 0 & 0 & 0 & 0 & 1 \\ 0 & 1 & 0 & 0 & 0 & 0 & 0 & 1 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \end{matrix}$$

This matrix M, which depends on the generator polynomial used, translates the connections of the flip-flop inputs with the flip-flop outputs. Each input corresponds to a row and each column to an output. If a row includes several "1"s, it means that the input corresponding to the row receives the sum of the outputs corresponding to the columns containing the "1"s, the sum being, in fact, an XOR operation.

By applying relation (1) eight times, that is, until the arrival of bit $b_{i+8}$, but by expressing the result as a function of the state $S(i)$ of the flip-flops, the following relation is obtained:

$$S(i+8) = B_{i/8} + M^8 S(i), \qquad (2)$$

where $B_{i/8}$ is the vector having $b_{i+1}$ to $b_{i+8}$ as components, and where $M^8$ is the eighth power of matrix M. This matrix $M^8$ is expressed by:

$$M^8 = \begin{matrix} 1 & 0 & 0 & 0 & 0 & 0 & 1 & 1 \\ 1 & 1 & 0 & 0 & 0 & 0 & 1 & 0 \\ 1 & 1 & 1 & 0 & 0 & 0 & 1 & 0 \\ 0 & 1 & 1 & 1 & 0 & 0 & 0 & 1 \\ 0 & 0 & 1 & 1 & 1 & 0 & 0 & 0 \\ 0 & 0 & 0 & 1 & 1 & 1 & 0 & 0 \\ 0 & 0 & 0 & 0 & 1 & 1 & 1 & 0 \\ 0 & 0 & 0 & 0 & 0 & 1 & 1 & 1 \end{matrix}$$

FIG. 3 shows an embodiment of a syndrome calculation circuit operating on a flow of words, which are bytes in this example. The circuit is based on relation (2) obtained above. Flip-flops S1 to S8 constitute a syndrome register. The outputs of flip-flops S1 to S8 are connected to the flip-flop inputs by an interconnection matrix corresponding to matrix $M^8$. To materialize the connections according to this matrix, the rule defined for above-mentioned matrix M is applied. Register S1–S8 is preceded by an adder 14 which performs, in parallel, the sum of the output of matrix $M^8$ and of each byte B supplied by a series-to-parallel converter 16 of the flow of bits b. Adder 14 is just a group of gates performing a bit-to-bit XOR.

With this configuration, the contents of flip-flops S1 to S8 are modified upon each arrival of a byte B, that is, at a rate 8 times smaller than the rate of the arrival of the bits b. Upon arrival of the fortieth bit, the circuit processes the fifth byte and supplies the syndrome that the circuit of FIG. 2 would have supplied.

As in the circuit of FIG. 2, register S1–S8 of FIG. 3 is reset after each bit packet for calculating the syndrome on the following bit packet. Thus, if the bit packets are not aligned with the headers for which the syndromes should be calculated, an alignment of the packets with the headers has to be carried out.

The present invention provides a sliding syndrome calculation circuit which limits, or even cancels, this alignment step.

FIG. 4 shows an embodiment of such a sliding syndrome calculation circuit, adapted to calculating the syndromes on n-word packets, for example packets of 5 bytes B. The principle of this circuit is to cancel in register S1–S8, upon each arrival of a word defining a new packet, the effect of the word preceding the new packet. Thus, the effects of all the words which precede the new packet are recursively cancelled, which has the same effect as resetting register S1–S8 at the beginning of the new packet.

Assume that the circuit has received six bytes $B_0$ to $B_5$, corresponding to one packet plus one byte. If relation (2) is developed to express state $S(48)$ of register S1–S8 as a function of bytes $B_0$ to $B_5$, the following relation is obtained:

$$S(48) = B_5 + M^8 B_4 + M^{16} B_3 + M^{24} B_2 + M^{32} B_1 + M^{40} B_0 \qquad (3)$$

Since the syndromes are to be calculated on the last forty bits, or the last 5 bytes $B_1$ to $B_5$, the last term $M^{40}B_0$ is one too many.

To obtain a sliding calculation of the syndrome, the last term is cancelled upon each arrival of a new byte. For this purpose, as shown in FIG. 4, the bytes B reach adder 14 both directly and via a delay circuit 18 of 5 bytes followed by an interconnection matrix $M^{40}$. This matrix corresponds to the fortieth power of matrix M. It is expressed as:

$$M^{40} = \begin{matrix} 0 & 0 & 1 & 1 & 0 & 0 & 0 & 1 \\ 1 & 0 & 1 & 0 & 1 & 0 & 0 & 1 \\ 0 & 1 & 1 & 0 & 0 & 1 & 0 & 1 \\ 0 & 0 & 1 & 1 & 0 & 0 & 1 & 0 \\ 0 & 0 & 0 & 1 & 1 & 0 & 0 & 1 \\ 1 & 0 & 0 & 0 & 1 & 1 & 0 & 0 \\ 1 & 1 & 0 & 0 & 0 & 1 & 1 & 0 \\ 0 & 1 & 1 & 0 & 0 & 0 & 1 & 1 \end{matrix}$$

This matrix defines the connections of the inputs of flip-flops S1 to S8 with the bits of each byte supplied by delay circuit 18. These connections are materialized according to the rule described with regard to matrix M.

As shown, at the arrival of byte $B_5$, adder 14 supplies the future state S(48) of register S1–S8 while this register still is at state S(40). Register S1–S8 will take state S(48) upon arrival of a byte B6.

Delay circuit 18 is, for instance, a FIFO buffer of 5 8-bit words. FIFO 18 represents no added surface since it is needed for storing each header during its error detection and correction processing. Interconnection matrix $M^{40}$ includes a majority of zeros and is thus not very complex.

The circuit of FIG. 4 performs a byte-by-byte sliding syndrome calculation over 5 bytes. If the bytes arriving to the circuit are aligned with the bytes of the headers, the header is detected as soon as its fifth byte, HEC, is supplied to the circuit. If the bytes supplied to the circuit are not aligned with the bytes of the headers, a header detection is achieved at the latest at the eighth cell by performing a bit skip after each cell length of received data. Thus, as much as 8 cells can be lost before detecting a header, which remains much more advantageous than a conventional syndrome calculation circuit, of the type of FIG. 2, in which as much as 40 cells can be lost.

To avoid losing cells, one may use eight circuits of the type of FIG. 4, each one of which processes bytes which are shifted by one bit with respect to the bytes processed by the preceding circuit. This solution is also more advantageous than a solution using 40 circuits of the type of FIG. 2. A still more advantageous embodiment will be further described in conjunction with FIG. 6.

If the transmission speed is low enough, the above-mentioned principle of the invention may be applied to bits instead of bytes or words.

Figure 5A:
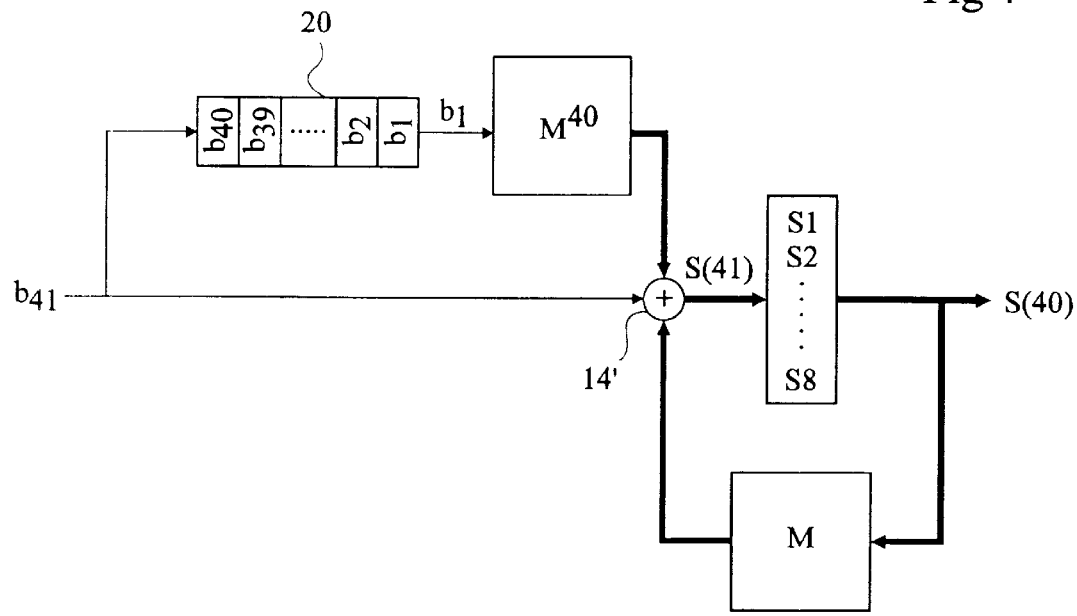
FIG. 5A illustrates an embodiment of a sliding syndrome calculation circuit according to the present invention, performing calculations on a bit flow.

FIG. 5A shows an embodiment of such a circuit performing, according to the invention, a bit-by-bit sliding syndrome calculation. The inputs of flip-flops S1 to S8 receive the outputs of these flip-flops via an interconnection matrix M and an adder 14'. Each bit to be processed b is directly supplied to adder 14'. According to the invention, the bits b are also supplied to adder 14' via a 40-bit delay circuit 20 followed by an interconnection matrix $M^{40}$. Matrix $M^{40}$ is applied to the sole output bit of delay circuit 20, which is considered as the first component of a vector (b*), the other seven components of which are equal to zero.

As shown, upon arrival of bit $b_{41}$, adder 14' supplies the future state S(41) of register S1–S8 while the register still is at state S(40). Register S1–S8 will take state S(41) upon arrival of a bit $b_{42}$.

Figure 5B:
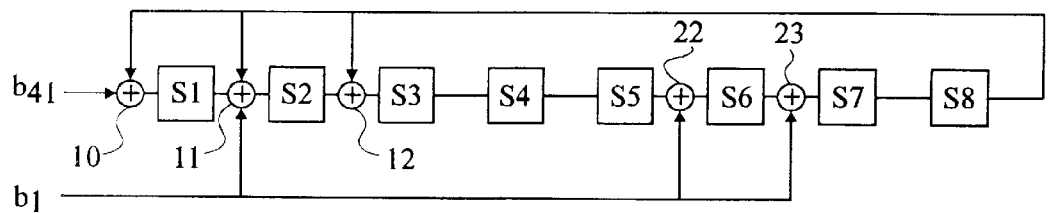
FIG. 5B shows a specific example of the sliding calculation circuit of FIG. 5A.

FIG. 5B shows in detail the syndrome calculation circuit of FIG. 5A applied to the example of FIG. 2. Matrix M connects flip-flops S1 to S8 together as in FIG. 2, by means of the same XOR gates 10, 11 and 12. Besides, each bit delayed by circuit 20 is supplied to gate 11 and to two further XOR gates 22 and 23 respectively preceding flip-flops S6 and S7. Indeed, applying matrix $M^{40}$ to a vector of first component $b_1$, the other components being equal to zero, provides a vector having all its components equal to zero except the second one, the sixth one and the seventh one, which are equal to $b_1$.

It should be noted, in FIG. 5B, that matrix M is materialized by adders 11 and 12 and by the connection of the output of flip-flop S8 to these adders and to the input of flip-flop S1. Matrix $M^{40}$ is materialized by the sole connection of delayed bit $b_1$ to adders 11, 22 and 23, with adder 14' corresponding to adders 10, 11, 22 and 23.

Figure 6:
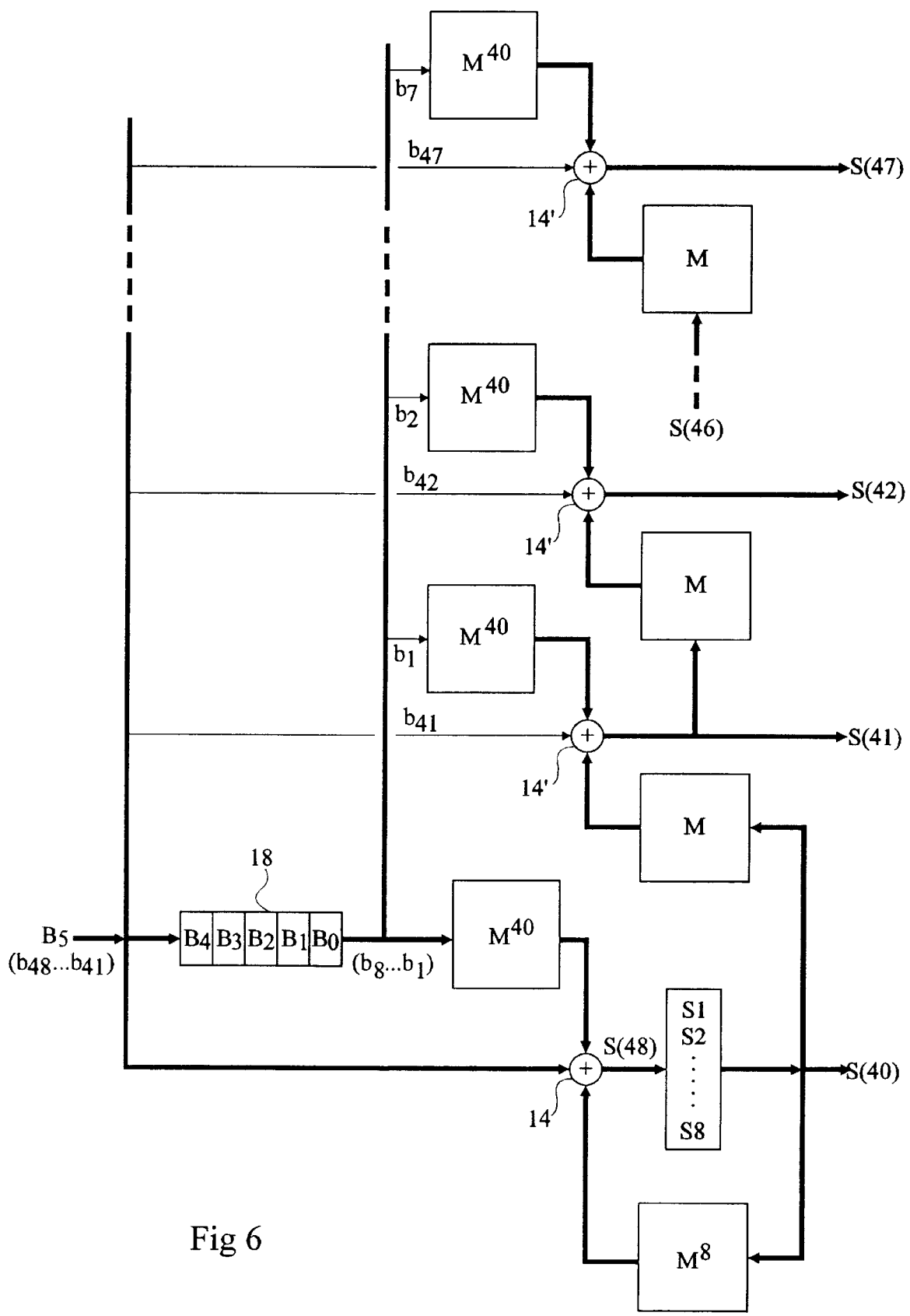
FIG. 6 shows an embodiment according to the invention of a circuit for sliding syndrome calculation on a word flow, which supplies one syndrome for each bit of each word.

FIG. 6 shows an embodiment of a byte-by-byte sliding syndrome calculation circuit which, to avoid losing at most eight cells during a phase for aligning the received bytes with the headers, supplies a syndrome for each bit of each received byte.

This circuit includes the structure of FIG. 4 for performing a byte-by-byte sliding syndrome calculation, to which are added several structures similar to the structure of FIG. 5A for performing bit-by-bit syndrome calculations. A bit-by-bit calculation structure is provided for each of the first seven bits of the processed bytes.

Each j-th bit ($b_{41}$ to $b_{47}$) of a received byte ($B_5$) is supplied to an adder 14' which further receives the j-th bit ($b_1$ to $b_7$) supplied by delay circuit 18 through a matrix $M^{40}$, and the output of adder 14' associated with the (j–1)-th bit through matrix M. The matrix M associated with the first bit receives the output (S(40)) of register S1-S8.

With this configuration, register S1-S8 and the seven adders 14' supply 8 syndromes S(40) to S(47) calculated on 8 40-bit packets, each of which is shifted by one bit with respect to the preceding one. If one of the syndromes S(40) to S(47) is equal to zero, the header searched for is partially contained in delay circuit 18, the missing bits of the header being the first bits of the new received byte $B_5$. The rank of the zero syndrome will indicate the shift to be performed in number of bits for realizing the alignment with the headers. For example, if syndrome S(42) is equal to zero, delay circuit 18 will contain a header with two missing bits. The series-to-parallel conversion performed upstream is then advanced by two bits, so that the next header received will be entirely within delay circuit 18, while the syndrome contained inside register S1–S8 will be equal to zero.

The structure of FIG. 6 is much simpler than the structure which would be obtained by repeating the structure of FIG. 4 eight times. Indeed, matrixes $M^8$ and $M^{40}$ of FIG. 4, which must both process vectors having all components variable, include together 38 XOR gates, while adder 14, receiving three vectors with all components variable, includes 16 XOR gates. Conversely, each of the structures performing the bit-by-bit calculations includes 5 XOR gates only (see FIG. 5B). Besides, only one delay circuit 18 and only one register S1–S8 are used.

Of course, each of the structures performing the bit-by-bit calculations in FIG. 6 operates at the rate of arrival of the bytes and not at the rate of arrival of the bits upstream of the series-to-parallel converter.

Various alterations, modifications and improvements of the present invention will readily appear to those skilled in the art. In particular, those skilled in the art will be able to find the matrixes needed for the implementation of the circuit of the invention according to the specific generator polynomial used, the number n of bits on which the syndrome is calculated, and the number p of bits of each datum to be processed.

Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalent thereto.

What is claimed is:

1. A circuit for calculating a syndrome on packets of n p-bit data, including a syndrome register receiving the sum of each received datum and of the contents of the syndrome register modified by a first interconnection matrix corresponding to a p-th power of a generator polynomial, wherein each received datum defines a new packet of n data and wherein said sum includes the datum preceding the new packet, modified by a second interconnection matrix corresponding to the n-th power of the first matrix.

2. A circuit according to claim 1, wherein the data are words whose p bits constitute the components of vectors processed by the matrixes.

3. A circuit according to claim 2, including for each j-th bit of a received word, an adder receiving this j-th bit, the output of the adder associated with the (j−1)-th bit through a matrix corresponding to the generator polynomial, and the j-th bit of the word preceding the new packet through a matrix corresponding to the np-th power of the generator polynomial, the adder associated with the first bit receiving the output of the syndrome register.

4. A circuit according to claim 1, wherein the data are bits, each of which constitutes the first components of a vector processed by the matrixes, a dimension of the vector being equal to the size of the syndrome register.

5. A circuit according to claim 1, wherein the datum preceding the new packet is supplied by a shift register of n data, receiving the data.

6. A circuit for providing a syndrome signal indicative of a syndrome based on packets of n p-bit data, the circuit comprising:

an adder having a first input that receives the packets of n p-bit data, a second input, and an output that provides a sum signal;

a syndrome register having an input, coupled to the output of the adder, that receives the sum signal, and an output that provides the syndrome signal; and first interconnection matrix circuitry having an input, coupled to the output of the syndrome register, that receives the syndrome signal, and an output, coupled to the second input of the adder, that provides a first packet signal indicative of the syndrome modified by a first interconnection matrix;

wherein the adder further includes a third input, and wherein the circuit further comprises;

second interconnection matrix circuitry including a second interconnection matrix and having an input that receives the packets of n p-bit data, and an output, coupled to the third input of the adder, that provides a second packet signal indicative of the packets of n p-bit data modified by the second interconnection matrix.

7. The circuit of claim 6, wherein the first interconnection matrix circuitry is arranged so that the first interconnection matrix corresponds to a p-th power of a generator polynomial.

8. The circuit of claim 6, wherein the second interconnection matrix circuitry is arranged so that the second interconnection matrix corresponds to an n-th power of the first interconnection matrix and includes a delay circuit in series with and downstream of said second interconnection matrix.

9. A circuit for providing a syndrome signal indicative of a syndrome based on packets of n p-bit data, the circuit comprising:

an adder having a first input that receives the packets of n p-bit data, a second input, and an output that provides a sum signal;

a syndrome register having an input, coupled to the output of the adder, that receives the sum signal, and an output that provides the syndrome signal; and means, coupled between the output of the syndrome register and the second input of the adder, for providing a first packet signal indicative of the syndrome modified by a first interconnection matrix;

wherein the adder further includes a third input, and wherein the circuit further comprises:

means, coupled to the third input of the adder, that provides a second packet signal indicative of the packets of n p-bit data modified by a second interconnection matrix.

10. The circuit of claim 9, wherein the means for providing the first packet signal is constructed and arranged such that the first interconnection matrix corresponds to a p-th power of a generator polynomial.

11. The circuit of claim 9, wherein the means for providing the second packet signal is constructed and arranged such that the second interconnection matrix corresponds to an n-th power of the first interconnection matrix and includes a delay circuit in series with and downstream of said second interconnection matrix.

12. A method for providing a syndrome signal indicative of a syndrome based on packets of n p-bit data, the method comprising the steps of:

providing a first packet signal indicative of a previous syndrome modified by a first interconnection matrix;

adding the packets of n p-bit data to the first packet signal to provide a sum signal; and passing the sum signal through a syndrome register to generate the syndrome signal;

wherein the step of adding includes a step of:

determining the sum signal based on a second packet signal indicative of the packets of n p-bit data modified by a second interconnection matrix.

13. The method of claim 12, wherein the step of providing the first packet signal includes a step of generating the first packet signal using a p-th power of a generator polynomial, as the first interconnection matrix.

14. The method of claim 12, wherein the step of determining the sum signal includes a step of generating the sum signal using an n-th power of the first interconnection matrix, as the second interconnection matrix.

* * * * *